(12) United States Patent
Lai et al.

(10) Patent No.: US 10,256,278 B2
(45) Date of Patent: Apr. 9, 2019

(54) DISPLAY DEVICE HAVING FORCE SENSING FUNCTION

(71) Applicant: AU Optronics Corporation, Hsin-Chu (TW)

(72) Inventors: Chun-Chi Lai, Hsin-Chu (TW);
Feng-Sheng Lin, Hsin-Chu (TW);
Tsang-Hong Wang, Hsin-Chu (TW);
Chia-Hsien Chu, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/851,914

(22) Filed: Dec. 22, 2017

(65) Prior Publication Data

US 2018/0190722 A1    Jul. 5, 2018

(30) Foreign Application Priority Data

Dec. 29, 2016 (TW) .............................. 105143976 A

(51) Int. Cl.
| | |
|---|---|
| *H01L 27/32* | (2006.01) |
| *H01L 51/52* | (2006.01) |
| *G06F 3/044* | (2006.01) |

(52) U.S. Cl.
CPC ............ *H01L 27/323* (2013.01); *G06F 3/044* (2013.01); *H01L 27/3276* (2013.01); *H01L 51/525* (2013.01); *H01L 51/5246* (2013.01); *H01L 51/5253* (2013.01); *G06F 2203/04105* (2013.01)

(58) Field of Classification Search
CPC . H01L 27/323; H01L 51/525; H01L 51/5253; H01L 51/5246; H01L 27/3276; G06F 3/044; G06F 2203/04105
See application file for complete search history.

(56) References Cited

U.S. PATENT DOCUMENTS

| | | | |
|---|---|---|---|
| 7,538,760 B2 | 5/2009 | Hotelling et al. | |
| 8,237,877 B2 | 8/2012 | Lee et al. | |
| 8,552,936 B2 | 10/2013 | Hente | |
| 8,633,916 B2 | 1/2014 | Bernstein et al. | |
| 8,723,813 B2 | 5/2014 | Park et al. | |
| 2006/0066772 A1* | 3/2006 | Takahashi | G02F 1/133308 349/60 |
| 2007/0222912 A1* | 9/2007 | Sato | G02F 1/133528 349/58 |
| 2014/0085213 A1 | 3/2014 | Huppi et al. | |
| 2014/0328051 A1* | 11/2014 | Yokonuma | G09F 3/10 362/97.1 |

FOREIGN PATENT DOCUMENTS

| | | |
|---|---|---|
| CN | 101661201 B | 9/2011 |
| CN | 204904244 U | 12/2015 |

\* cited by examiner

*Primary Examiner* — Rodney Amadiz
(74) *Attorney, Agent, or Firm* — WPAT, PC

(57) ABSTRACT

A display device includes a frame, a protrusion, a display panel, a protective substrate, and a buffer material. The frame includes a bottom plate and a side plate; and the bottom plate has an inner surface, and the side plate is on the inner surface of the bottom plate. The protrusion is disposed on the inner surface of the bottom plate. The display panel is disposed on the protrusion and includes a force sensitive layer. A protection substrate is disposed on the display panel. The buffer material is connected with the protection substrate and the side plate of the frame, and the buffer material has a greater elastic coefficient than the protrusion.

19 Claims, 11 Drawing Sheets

DISPLAY DEVICE HAVING FORCE SENSING FUNCTION

BACKGROUND

Technical Field

The present invention relates to a display device, and in particular, to a display device having a force sensing function.

Related Art

At present, with increasingly developing science and technology, display devices have become an indispensible component of peoples' daily life nowadays. Peoples' life becomes more convenient with the help of display devices. In recent years, the display devices are developed to be more convenient, artistic, and multifunctional, so as to provide more options for users.

Flat display devices have advantages of a light, thin, and short, as well as energy-saving, and therefore have been widely used in various electronic products, such as a notebook computer, a tablet PC, a TV, a smart phone, and wearable electronic devices. In order to improve convenience of use, how to enable a flat display device to further provide other functions in addition to image displaying to therefore reduce the whole weight and volume of the display device has become an urgent aim of persons skilled in the art. In recent years, most display devices have a touch function to facilitate operating, and recently, how to add a force sensing function to an existing display device further becomes an urgent problem to solve by persons skilled in the art.

SUMMARY

A preferred embodiment of the present invention provides a display device, comprising a frame, a protrusion, a display panel, a protective substrate, and a buffer material. The frame includes a bottom plate and a side plate, and the bottom plate has an inner surface, and the side plate is on the inner surface of the bottom plate. The protrusion is disposed on the inner surface of the bottom plate. The display panel is disposed on the protrusion and comprises a force sensitive layer. A protective substrate is disposed on the display panel. The buffer material is disposed between the protective substrate and the side plate of the frame, and the buffer material has a greater elastic coefficient than the protrusion.

By means of the above design, the display device has a force sensing function, and by means of the design of the protrusion and the buffer material with suitable elastic coefficients, a force sensitive signal is enabled to be better, and better force signal sensing can be achieved.

DETAILED DESCRIPTION

In order to enable persons of ordinary skill in the art to further understand the present invention, the features of the present invention and the effects to be achieved are described in detail below through preferred embodiments of the present invention and with reference to the accompanying drawings.

Figure 1:
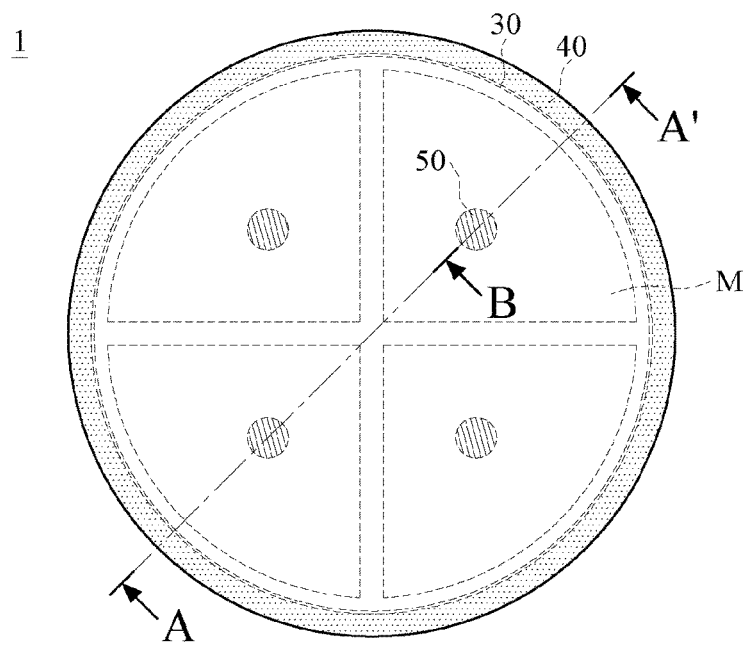
FIG. 1 is illustrative of a schematic top view of a display device according to a first embodiment of the present invention.
Figure 2:
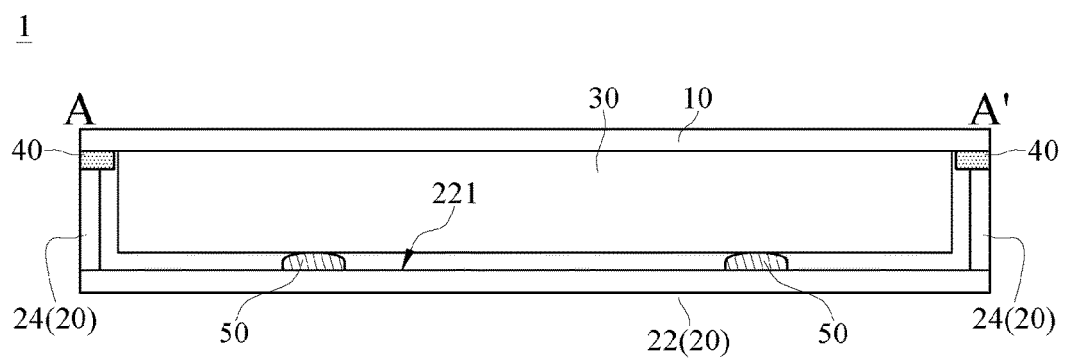
FIG. 2 is a schematic cross-sectional view of the display device along a sectional line A-A' of FIG. 1.
Figure 3:
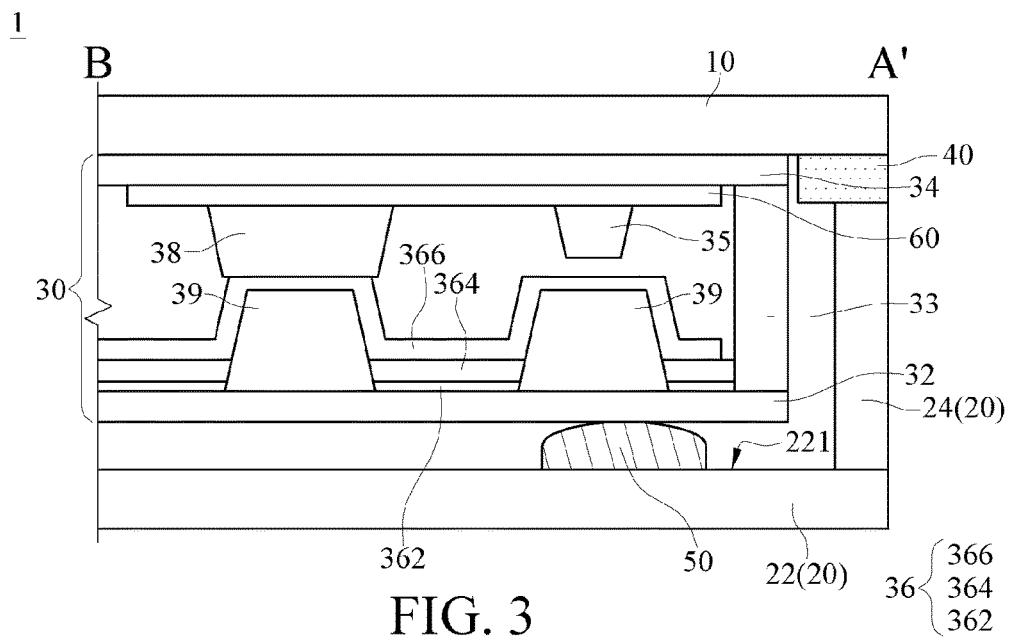
FIG. 3 is a schematic enlarged cross-sectional view of the display device along a sectional line B-A' of FIG. 1.

Refer to FIG. 1 to FIG. 3. FIG. 1 to FIG. 3 are illustrative of schematic diagrams of a display device according to a first embodiment of the present invention. FIG. 1 is illustrative of a schematic top view of a display device according to a first embodiment of the present invention; FIG. 2 is a schematic cross-sectional view of the display device along a sectional line A-A' of FIG. 1; and FIG. 3 is a schematic enlarged cross-sectional view of the display device along a sectional line B-A' of FIG. 1. To make the features of the display device of the present invention more apparent, some elements are not drawn in the figures. As shown in FIG. 1 to FIG. 3, a display device 1 in this embodiment includes a frame 20, a display panel 30, a protective substrate 10, a buffer material 40, and a protrusion 50. The frame 20 comprises a bottom plate 22 and a side plate 24 surrounding the peripherals of the bottom plate 22. The bottom plate 22 is connected with the side plate 24 and has an inner surface 221. The side plate 24 is disposed on the inner surface 221 of the bottom plate 22. At least one protrusion 50 is disposed on the inner surface 221 of the bottom plate 22. The display panel 30 is disposed on the bottom plate 22 such that the protrusion 50 is located between the display panel 30 and the bottom plate 22. The protective substrate 10 is disposed on the display panel 30. The buffer material 40 is disposed between the protective substrate 10 and the side plate 24 of the frame 20. The material of the frame 20 includes a plastic material and a metal material, but the present invention is not limited herein. The material of the bottom plate 22 of the frame 20 may be the same as or different from the material of the side plate 24 of the frame 20. The bottom plate 22 and the side plate 24 of the frame 20 may be connected by means of a connection structure or may also be formed integrally, but the present invention is not limited herein. The protective substrate 10 is a transparent substrate, and may be a hard substrate or a flexible substrate, for example, a glass substrate, a quartz substrate, or a plastic substrate, but the present invention is not limited herein. The display panel 30 is a display panel having a force sensing function, and the detailed structure of the display panel is described below. An elastic coefficient of the protrusion 50 is smaller than an elastic coefficient of the buffer material 40. The material of the buffer material 40 may be foam or rubber, but the present invention is not limited herein. The material of the protrusion 50 may be plastic or metal, but the present invention is not limited herein.

Referring to FIG. 3, FIG. 3 is a schematic enlarged cross-sectional view of the display device along a sectional line B-A' of FIG. 1. The display panel 30 includes a first substrate 32, a second substrate 34, a display medium 36, a force sensitive layer 60, and a sealant 33. The display panel 30 is disposed on the bottom plate 22. The first substrate 32 and the second substrate 34 are disposed opposite to each other. The sealant 33 is connected with the first substrate 32 and the second substrate 34. The first substrate 32 and the second substrate 34 each may be a transparent substrate, and may be a hard substrate or a flexible substrate, for example, a glass substrate, a quartz substrate, or a plastic substrate, but the present invention is not limited herein. The display medium 36 is located between the first substrate 32 and the second substrate 34. In this embodiment, the first substrate 32 is provided with a plurality of active devices (not shown) and a display medium 36. The active devices are transistors, for example, each electrically connected to the display medium 36, to control light emitting separately. The display medium 36 may be a light emitting diode, for example an organic light emitting diode (OLED), and includes lower electrode layers 362, light-emitting materials 364, and an upper electrode layer 366. The lower electrode layers 362 are electrically connected to the active devices, and the lower electrode layers 362 may be used as an anode of the light-emitting material 364. The light-emitting material 364 is disposed between the lower electrode layer 362 and the upper electrode layer 366. The light-emitting material 364 may be a light-emitting material capable of emitting various colours of light, but the present invention is not limited herein. The upper electrode layer 366 may be a cathode of the light-emitting material 364. At least one first insulator 38 is disposed on the upper electrode layer 366, and between the upper electrode layer 366 and the second substrate 34. The force sensitive layer 60 is disposed between the first insulator 38 and the second substrate 34. Therefore, there is a gap between the upper electrode layer 366 and the force sensitive layer 60, thereby forming a capacitor as force sensitive set. Whether a force is applied to the display device 1 can be sensed by means of detecting a change of a capacitance between the upper electrode layer 366 and the force sensitive layer 60. In addition, as shown in FIG. 1, the force sensitive layer 60 may be divided into a plurality of force sensitive segments M according to needs. The force sensitive segments M are spaced one another and are used to detect force signals in different regions. In this embodiment, for example, the force sensitive layer 60 is divided into four force sensitive segments, but the present invention is not limited herein. In addition, the display panel 30 may further include a plurality of spacers 39 disposed between the upper electrode layer 366 and the first substrate 32, and used for space light-emitting materials 364 of different colours. Moreover, the first insulator 38 is overlapped with the spacer 39 in a direction vertical to the first substrate 32. The gap between the force sensitive layer 60 and the upper electrode layer 366 can be adjusted by means of adjusting the height of the first insulator 38 and the spacer 39, so as to achieve a better force sensing effect. In addition, at least one auxiliary insulator 35 may be further disposed on the second substrate 34 at a side facing the upper electrode layer 366. The auxiliary insulator 35 is overlapped with the spacer 39 at a direction vertical to the first substrate 32. However, the height of the auxiliary insulator 3 is less than the height of the first insulator 38. Moreover, the auxiliary insulator 35 does not contact the upper electrode layer 366. When a force is applied to the display device, the changeable gap between the force sensitive layer 60 and the upper electrode layer 366 can be increased, to enable the capacitor signal change become more apparent, thereby achieving a better force sensing effect. The first insulator 38 and the auxiliary insulator 35 may be separately disposed by means of different processes, and may also be designed by means of a suitable photolithography after being coated by a material simultaneously, to achieve different heights.

The material of the force sensitive layer 60 may be a transparent conductive material, for example, indium tin oxide, indium zinc oxide, or other suitable transparent conductive materials, polymer conductive materials, or other suitable conductive materials, and the force sensitive layer 60 may be a single layer structure or a multilayer structure. The first insulation layer 38, the spacers 39, and the auxiliary insulator 35 may be a single layer structure or a multilayer structure, and the material thereof may be an inorganic dielectric material such as silicon oxide, silicon nitride, or silicon oxynitride, or organic dielectric material such as acrylic, or an organic/inorganic mixed material, but the present invention is not limited herein.

Figure 4:
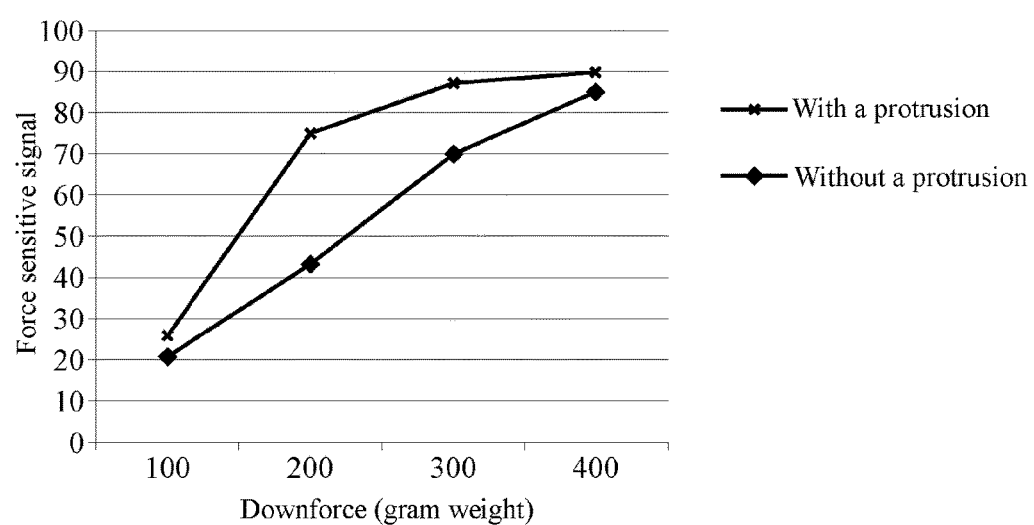
FIG. 4 is illustrative of force sensitive signal results of a display device in the structure of this embodiment and in a structure without a protrusion.

Referring to FIG. 4, FIG. 4 is illustrative of force sensitive signal results of a display device in the structure of this embodiment and in a structure without a protrusion. In FIG. 4, the horizontal coordinate is an applied downforce, and the vertical coordinate is a force sensitive signal. The structures of the display device are with a protrusion (-X-) and without a protrusion (-♦-), and the remaining conditions are the same. In this experiment, the elastic coefficient of the used buffer material is 280 mm/(gf/mm^2), and the elastic coefficient of the used protrusion is 0.0035 mm/(gf/mm^2). As shown in FIG. 4, it can be known that when the same downforce is applied, the force sensitive signal of the display device with a protrusion may be greater than the force sensitive signal of the display device without a protrusion. For example, under the condition that the downforce is about 200 gram weight, the force sensitive signal of the display device without a protrusion is about 40 to 50, but the force sensitive signal of the display device with a protrusion may be about 70 to 80. In this experiment, the force sensitive signal is obtained through calculation based on the change of the capacitance between the force sensitive layer 60 and the upper electrode layer 366. The force sensitive signal is great when the change in the capacitor is great. As can be known from the experiment, when the protrusion 50 is disposed between the display panel 30 and the bottom plate 22 of the frame 20 for the display device, the force sensitive signal can be enhanced, thereby enabling the force sensing effect to be more accurate.

The following table shows test results of force sensitive signals by using buffer materials and protrusions of different elastic coefficients.

TABLE 1

| | Elastic coefficient mm/(gf/mm$^2$) | | | |
|---|---|---|---|---|
| Buffer material | x ≥ | x ≥ | x ≥ | x < |
| Elastic coefficient x | 0.0655 | 0.0655 | 0.0655 | 0.0655 |
| Protrusion | 0 < y ≤ | 0.00655 < y ≤ | y ≥ | 0 < |
| Elastic coefficient y | 0.00655 | 0.0655 | 0.0655 | y |
| Force sensing effect | ○ | Δ | — | — |

○: good; Δ: acceptable; and —: no obvious difference.

As can be seen from table 1 that, the effect is good when the elastic coefficient y of the protrusion is greater than 0 and less than 0.00655 mm/(gf/mm$^2$), the elastic coefficient x of the buffer material is greater than 0.0655 mm/(gf/mm$^2$), and the effect is good when a ratio (x/y) of the elastic coefficient x of the buffer material to the elastic coefficient y of the protrusion is greater than 10. That is, the force sensing effect is good when the protrusion is relatively not elastic and relatively hard, and the buffer material is relatively elastic and soft.

Figure 5A:
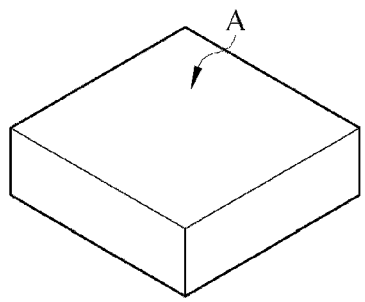
FIG. 5(a) is a schematic diagram of the shape of a test sample.
Figure 5B:
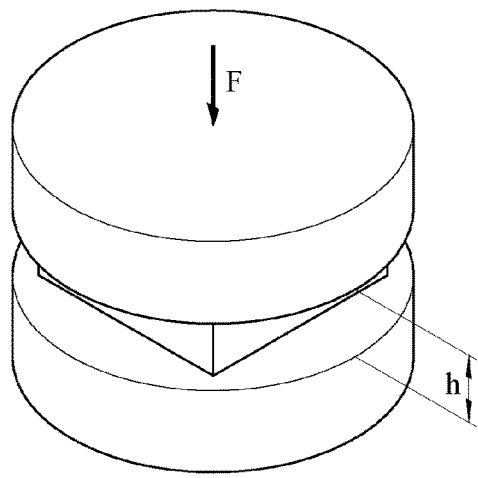
FIG. 5(b) is a schematic diagram of a test device.
Figure 5C:
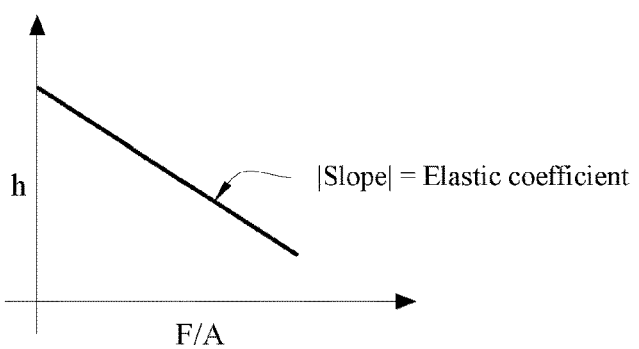
FIG. 5(c) is a diagram of a measurement result of the height of a measured object while applying a force thereto.

FIG. 5 is illustrative of a measurement method of the elastic coefficient of the present invention. FIG. 5(a) is a schematic diagram of the shape of a test sample; FIG. 5(b) is a schematic diagram of a test device; and FIG. 5(c) is a diagram of a measurement result of the height of a measured object while applying a force thereto. The material is first cut into squares of 30 mm*30 mm (the area: A), and a plurality of squares are stacked to reach a thickness of about 10 mm, as shown in FIG. 5(a). The test sample is placed on the test device, as shown in FIG. 5(b). The test device applies a downforce F, and then, the height h of the test sample is measured, so that a measurement result graph of the height h of the test sample when a pressure (F/A) is applied thereto. An absolute value of the slope, that is, the elastic coefficient of the material, is then calculated by using the slope of the graph. The elastic coefficient of the material can be obtained by means of the measurement method.

Figure 6A:
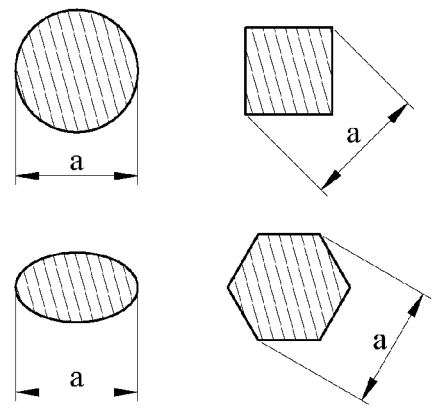
FIG. 6(a) is illustrative of a schematic top view of the shape of some protrusions.
Figure 6B:
FIG. 6(b) is illustrative of a schematic cross-sectional view of the shape of some protrusions.
Figure 6B:
Figure 6B:
Figure 7A:
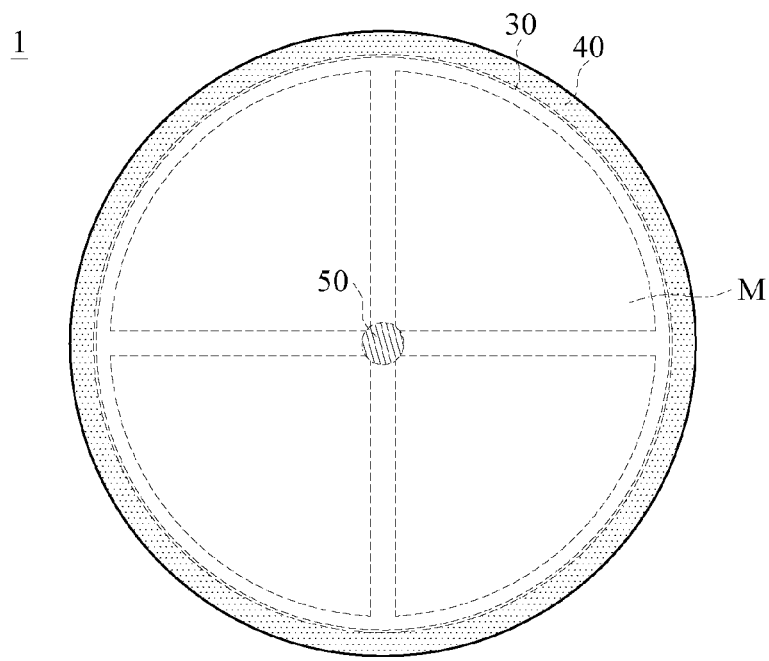
FIG. 7(a) to FIG. 7(g) are illustrative of schematic top views of the positions of the protrusions and force sensitive segments of various variant embodiments on the display device.
Figure 7B:
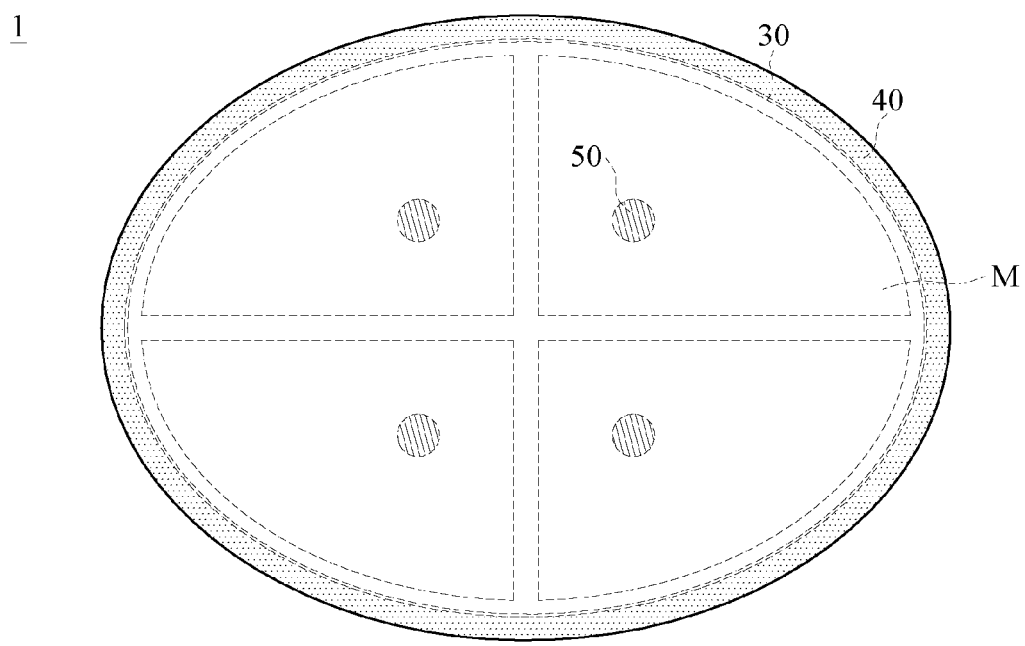
Figure 7C:
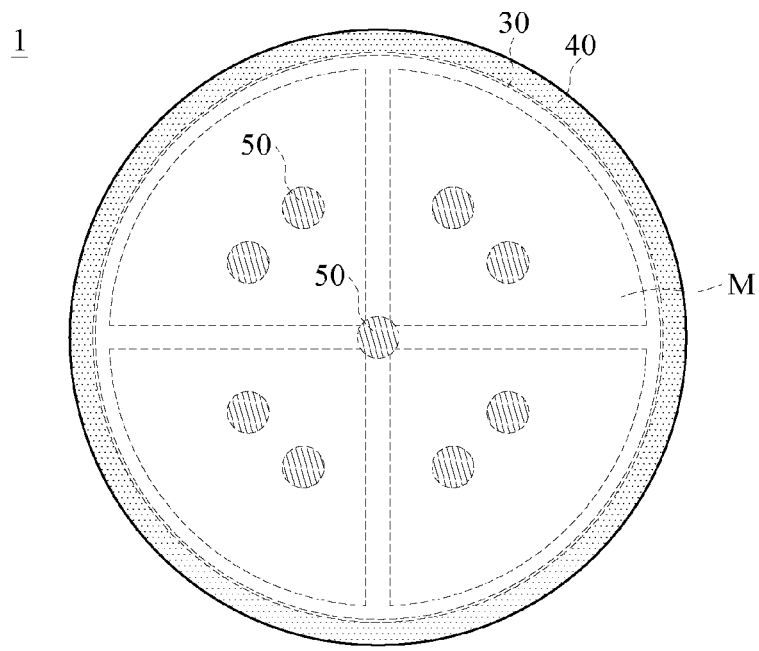
Figure 7D:
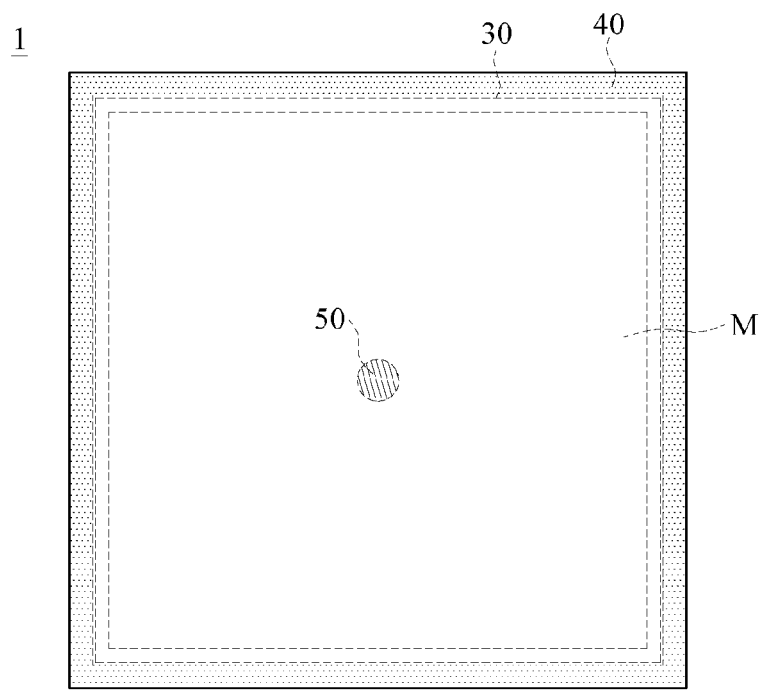
Figure 7E:
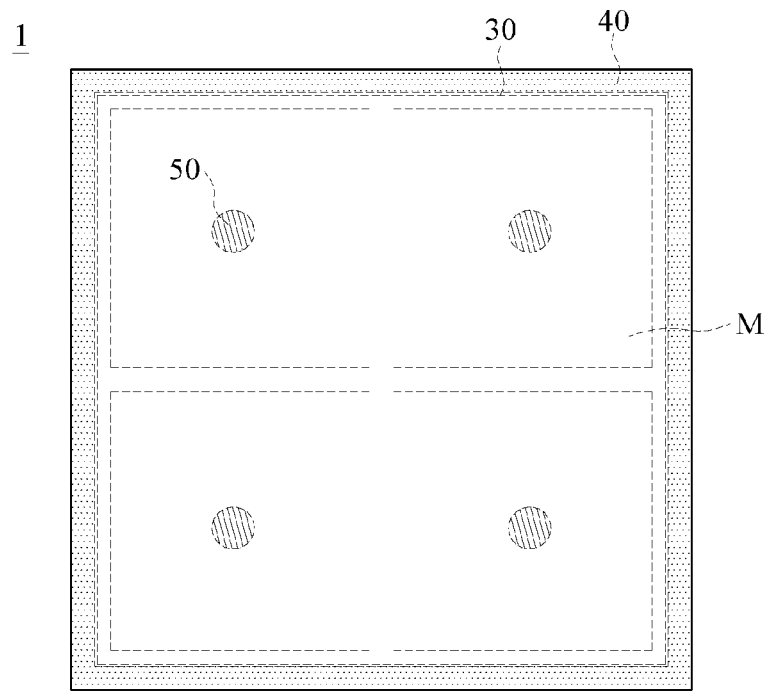
Figure 7F:
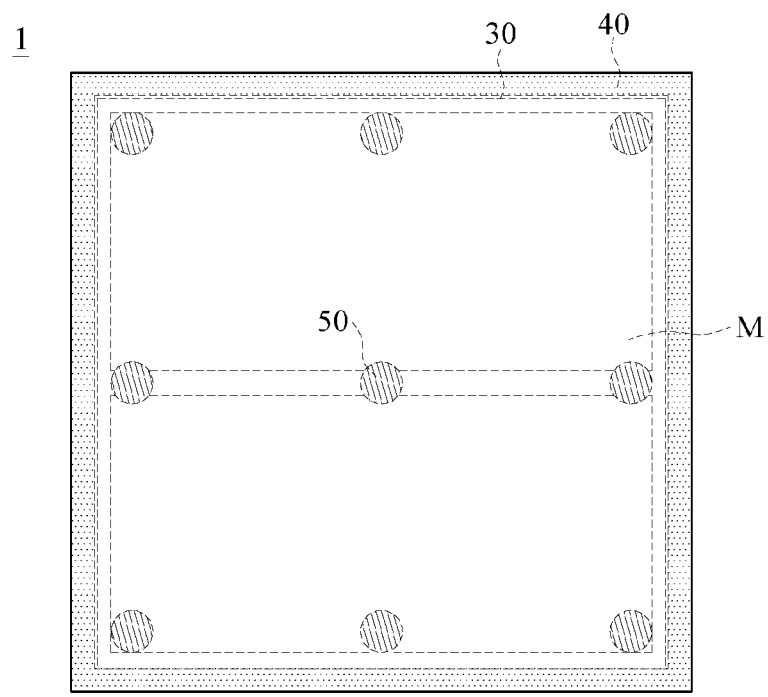
Figure 7G:
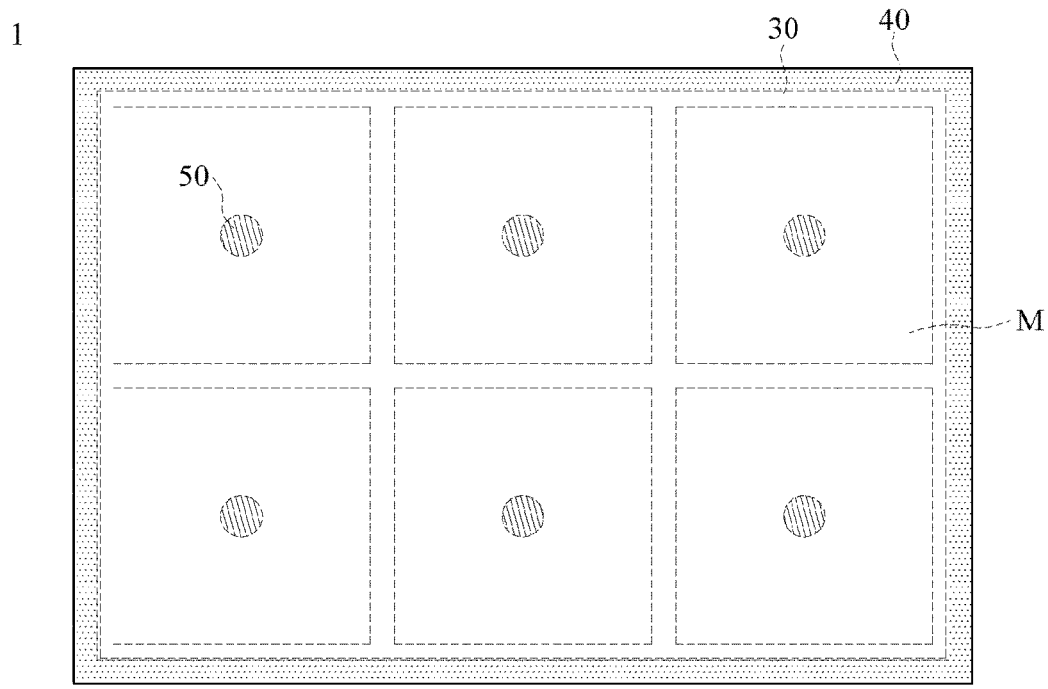

In this embodiment, the top view of the shape of the protrusion 50 is a circle, and the cross-sectional view of the shape is a raised block with a surface being an arc, but the present invention is not limited herein. Referring to FIG. 6, FIG. 6(a) is illustrative of a schematic top view of the shape of some protrusions. As shown in FIG. 6(a), the top view of the shape of the protrusion may also be a rectangle, a hexagon, an ellipse, or the like, but the present invention is not limited herein. FIG. 6(b) is illustrative of a schematic cross-sectional view of the shape of some protrusions. As shown in FIG. 6(b), the cross-sectional view of the shape of the protrusion may also be a semi-circle, a rectangle, a trapezoid, or the like, but the present invention is not limited herein. The effect is good when the size a of the protrusion is greater than 0.5 mm and less than 5 mm. The effect is good when the height b of the protrusion is greater than 0.7 mm and less than 5 mm. In addition, generally the height of the buffer material 40 is greater than or equal to the height of the protrusion 50 and a sufficient deformation can be provided when a downforce is applied to the display device, and a reacting force in a direction opposite to the direction of the downforce is applied to the display panel 30 by means of the frame and the protrusion 50, to change the cell gap of the display panel 30, so as to enhance the force sensing effect.

In this embodiment, for example, the display device is in a circle shape, the force sensitive layer 60 is divided into four force sensitive segments M, and the protrusions 50 are disposed in the respective force sensitive segments M, but the present invention is not limited herein. Referring to FIG. 7, FIG. 7(a) to FIG. 7(g) are illustrative of schematic top views of the positions of the protrusions and force sensitive segments of various variant embodiments on the display device. As shown in FIG. 7, the display device of the present invention may also be of a square, an ellipse, a rectangle, or any other shape. There may be one or a plurality of force sensitive segments M. There may be one or a plurality of protrusions 50. The protrusion 50 may be disposed in the force sensitive segment M, or may also be disposed between the force sensitive segment M and the force sensitive segment, or may be simultaneously disposed in the force sensitive segments M, or between the force sensitive segment M and the force sensitive segment. From the experiment, it can be obtained that the force sensing effect is good when the ratio of a total projection overlapped area of all the disposed protrusions 50 on the first substrate 32 to the area of the first substrate 32 is greater than 0.02% and less than 2%.

The display device of the present invention is not limited to the embodiments. The following sequentially describes the display panel of the other preferred embodiments of the present invention, and in order to compare the differences between the embodiments and simplify description, the same reference numeral indicates the same element in the embodiments of the context, and mainly the differences between the embodiments are described without repeatedly describing the same part.

Figure 8:
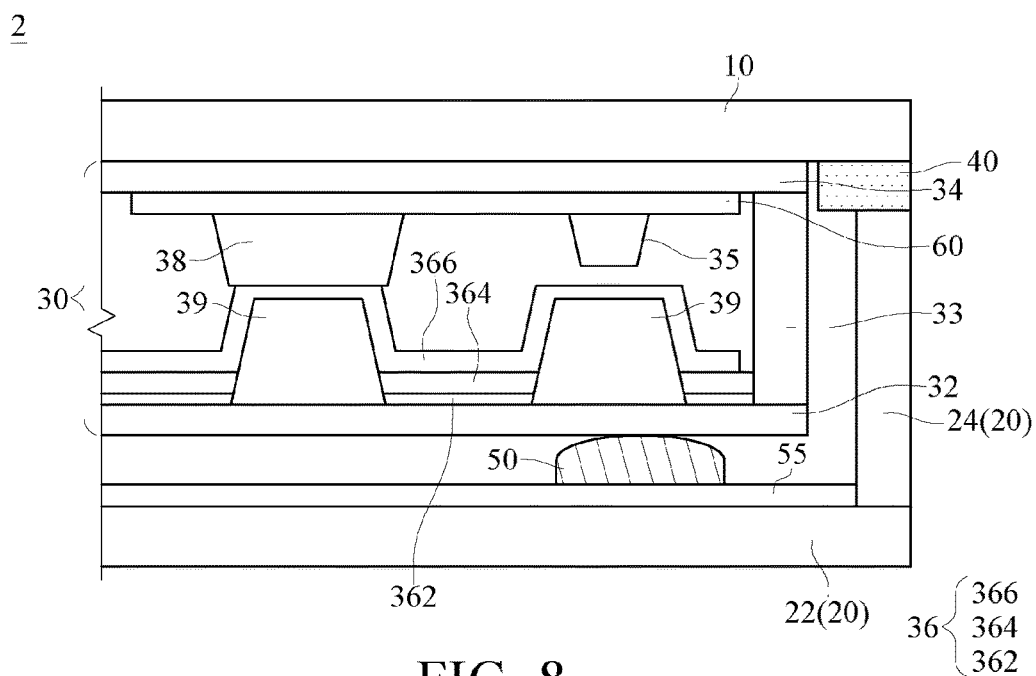
FIG. 8 is illustrative of a schematic enlarged cross-sectional view of a display device of a variant embodiment of the first embodiment of the present invention.
Figure 9:
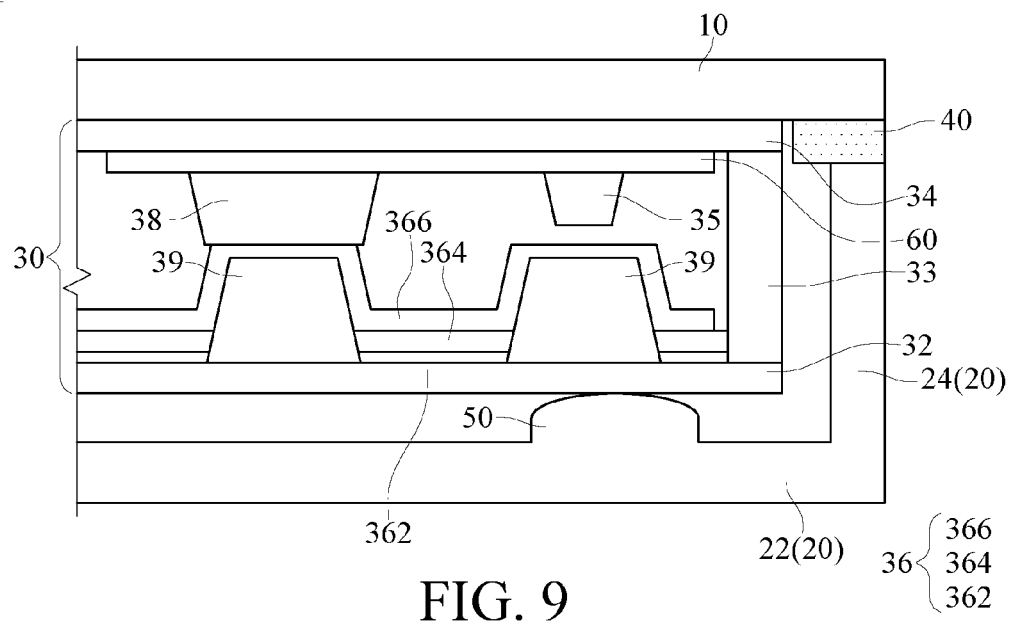
FIG. 9 is illustrative of a schematic enlarged cross-sectional view of a display device of another variant embodiment of the first embodiment of the present invention.

Refer to FIG. 8 and FIG. 9 in combination with FIG. 1 and FIG. 2. FIG. 8 is illustrative of a schematic enlarged cross-sectional view of a display device of a variant embodiment of the first embodiment of the present invention. FIG. 9 is illustrative of a schematic enlarged cross-sectional view of a display device of another variant embodiment of the first embodiment of the present invention. As shown in FIG. 8, the protrusion 50 may be disposed on a support layer 55. The material of the support layer 55 generally may be the same as the material of the protrusion 50, or may also be different from the material of the protrusion 50. By disposing the protrusion 50 on the support layer 55, a relative position between the protrusion 50 and the display panel 30 can be located more easily during assembly. As shown in FIG. 9, the protrusion 50 and the bottom plate 22 of the frame 20 may also be formed integrally, such that the thickness of the display device is enabled to be thinner, and the position of the protrusion 50 on the display device can also be located more easily.

Figure 10:
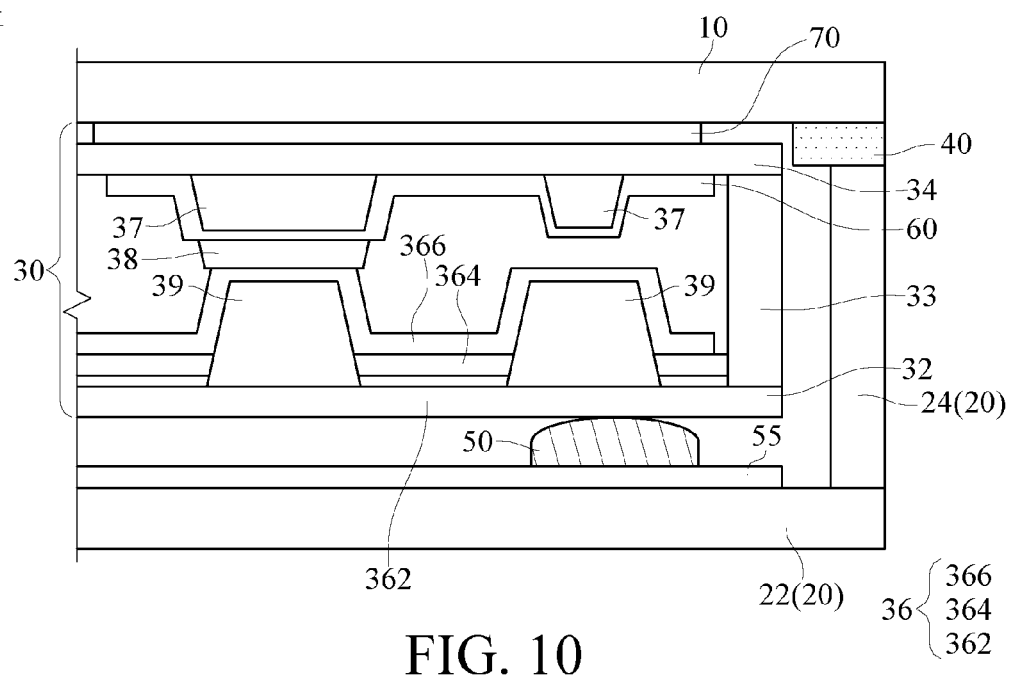
FIG. 10 is illustrative of a schematic enlarged cross-sectional view of a display device of still another variant embodiment of the first embodiment of the present invention.

Refer to FIG. 10 in combination with FIG. 1 and FIG. 2. FIG. 10 is illustrative of a schematic enlarged cross-sectional view of a display device of still another variant embodiment of the first embodiment of the present invention. What is different from the above embodiment is that the display panel 30 of this embodiment may further include at least one second insulator 37 between the second substrate 34 and the force sensitive layer 60, the second insulator 37, the first insulator 38 and the spacers 39 are overlapped in a direction vertical to the first substrate 32, such that the minimum distance from the force sensitive layer 60 to the upper electrode layer 366 can be reduced, thereby making the force sensing effect better. In addition, a touch sensitive layer 70 may be further provided between the display panel 30 and the protective substrate 10, so as to enable the display device to have a touch sensitive function in addition to the display function and the force sensing function. The touch sensitive layer 70 may be of a self capacitance touch sensitive type or a mutual capacitance touch sensitive type, but the present invention is not limited herein. The touch sensitive layer 70 may be directly disposed on the second substrate 34, or may also be disposed on another substrate (not shown) which is then disposed on the second substrate 34, but the present invention is not limited herein.

Figure 11:
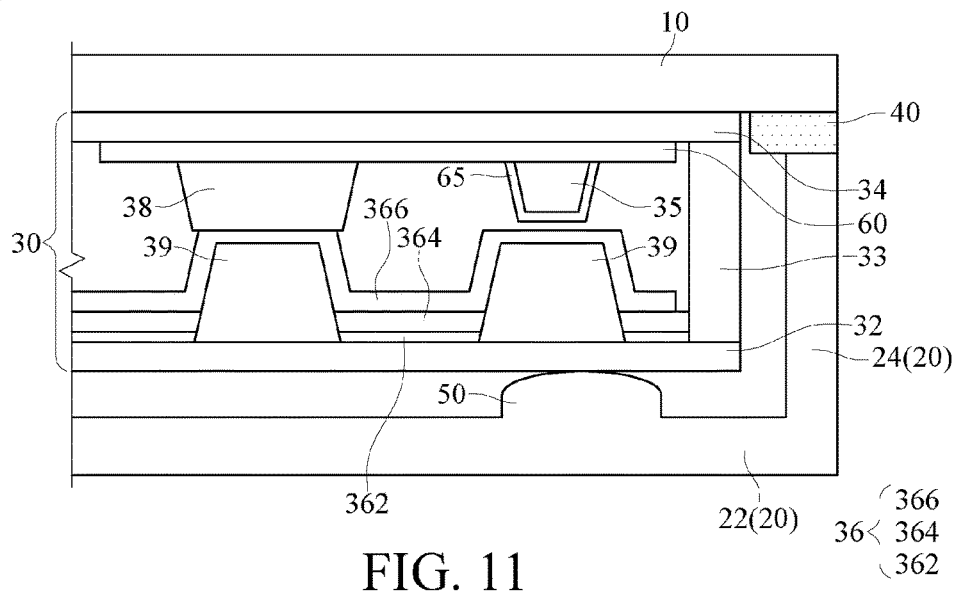
FIG. 11 is illustrative of a schematic enlarged cross-sectional view of a display device of still another variant embodiment of the first embodiment of the present invention.

Refer to FIG. 11 in combination with FIG. 1 and FIG. 2. FIG. 11 is illustrative of a schematic enlarged cross-sectional view of a display device of still another variant embodiment of the first embodiment of the present invention. What is difference from the above embodiment is that an auxiliary conductive layer 65 may further be disposed on the auxiliary insulator 35, and the auxiliary conductive layer 65 does not contact the upper electrode layer 366. The auxiliary conductive layer 65 is electrically connected to the force sensitive layer 60, and may also be used in a force sensing function, and therefore the minimum force sensing distance can be reduced, thereby making the force sensing effect better. The material of the auxiliary conductive layer 65 may be the same as or different from the material of the force sensitive layer 60. The materials may be both selected as transparent conductive materials, or one of the materials is selected as a transparent conductive material, and the other one is selected as a metal material having a good electric conductivity, so as to make the electric conduction better.

Figure 12:
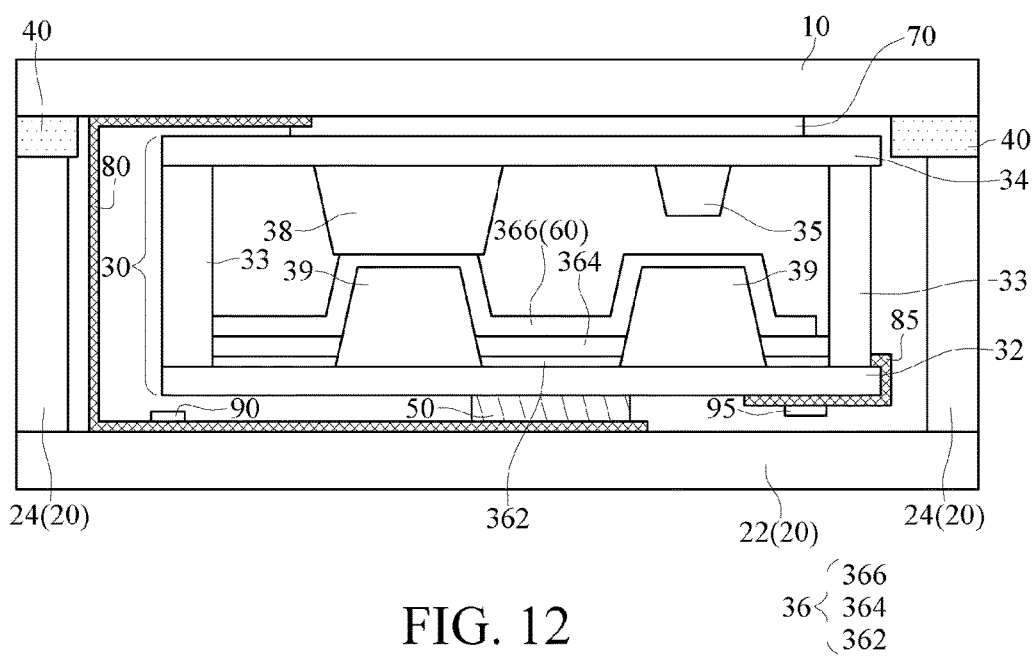
FIG. 12 is illustrative of a schematic enlarged cross-sectional view of a display device according to a second embodiment of the present invention.

Refer to FIG. 12 in combination with FIG. 1 and FIG. 2. FIG. 12 is illustrative of a schematic enlarged cross-sectional view of a display device according to a second embodiment of the present invention. The display panel 30 of this embodiment includes a first substrate 32, a second substrate 34, a display medium 36, a first insulator 38, and a sealant 33. The first substrate 32 and the second substrate 34 are disposed opposite to each other, and the sealant 33 is connected with the first substrate 32 and the second substrate 34. The display medium 36 is located between the first substrate 32 and the second substrate 34. The display medium 36 includes a lower electrode layer 362, a light-emitting material 364, and an upper electrode layer 366. The display medium 36 may be a light emitting diode, for example an organic light emitting diode (OLED), but the present invention is not limited herein. At least one first insulator 38 is disposed on the upper electrode layer 366, and between the upper electrode layer 366 and the second substrate 34. The upper electrode layer 366 may be a cathode of the light-emitting material 364. What are different from the above embodiment are that in this embodiment, the upper electrode layer 366 may also used as a force sensitive layer 60, the protrusion 50 is made of a metal and is used as an electrode, the force sensitive layer 60 the protrusion 50 form a capacitor, used as a force sensitive set, and a force signal can be sensed by means of detecting a change in the capacitor between the force sensitive layer 60 and the protrusion 50. In addition, in this embodiment, a touch sensitive layer 70 is further provided, such that the display device is enabled to further have a touch sensitive function in addition to the display function and the force sensing function. The touch sensitive layer 70 may be of a self capacitance touch sensitive type or a mutual capacitance touch sensitive type, but the present invention is not limited herein. The flexible circuit board 80 is connected with the touch sensitive layer 70 and is used to provide and detect a touch signal. The flexible circuit board 80 may skip a side edge of the second substrate 34 and extend through a side edge of the sealant to a position between the first substrate 32 and the frame20. The protrusion 50 is made of a metal and used as an electrode of a force sensitive set, and is disposed on the sensitive flexible circuit board 80. The material of the protrusion 50 may be, for example, aluminum, gold, copper, indium, tin, silver, tungsten, or an alloy of the above, but the present invention is not limited herein. In addition, an integrated circuit element 90 may be further provided on the sensitive flexible circuit board 80, and the integrated circuit element 90 may simultaneously control the touch sensitive layer 70 and the force sensitive set. In addition, the display panel30 of the display device may also have a flexible circuit board 85 for a display panel, and the flexible circuit board 85 for a display pane is provided with an integrated circuit element 95 for a display panel.

Figure 13:
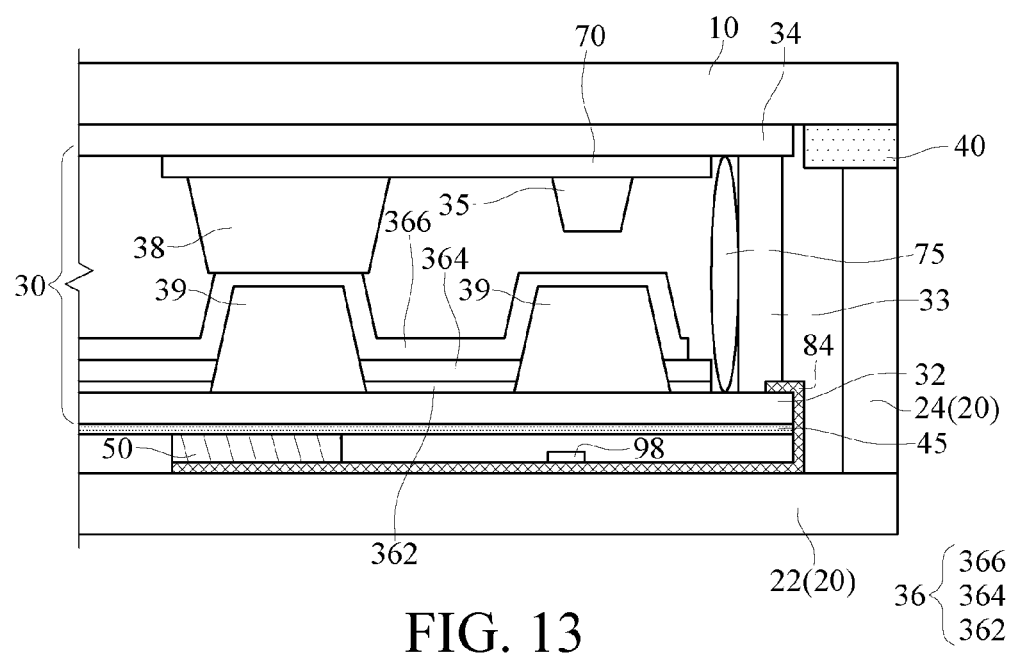
FIG. 13 is illustrative of a schematic enlarged cross-sectional view of a display device of a variant embodiment of the second embodiment of the present invention.

Refer to FIG. 13 in combination with FIG. 1 and FIG. 2. FIG. 13 is illustrative of a schematic enlarged cross-sectional view of a display device of a variant embodiment of the second embodiment of the present invention. What are different from the above embodiment are that the touch sensitive layer 70 of this embodiment is disposed in the display panel 30 and disposed between the first insulator 38 and the second substrate 34; a signal of the touch sensitive layer 70 may be transmitted to the first substrate 32 by means of the conductive glue 75; the flexible circuit board 84 is electrically connected to the display medium 36 and the touch sensitive layer 70 of the display panel 30; and the flexible circuit board 84 extends from the first substrate 32, via a side edge of the first substrate 32, to a position above the inner surface 221 of the frame 20. A protrusion 50 is also disposed on the flexible circuit board 84, and the protrusion is made of a metal and may be used as an electrode of the force sensitive set. The integrated circuit element 98 is disposed on the flexible circuit board 84, and simultaneously drives and controls the display panel 30, the touch sensitive layer 70, and the force sensitive set. As compared with the previous embodiment, in this embodiment, the display panel, the touch sensitive layer 70, and the force sensitive set can be driven and controlled only by using a flexible circuit board, and the touch sensitive layer and the force sensitive set are integrated in the display panel, such that the display device has a small volume and a light weight. Further, a protective layer 45 may be further disposed between the protrusion 50 and the first substrate 32. The material of the protective layer 45 may be, for example, foam and rubber, but the present invention is not limited herein. The protective layer 45 may protect the panel, or may also be used for changing the distance between the force sensitive layer 60 and the protrusion 50 when a force is applied to the display device, thereby making the force sensing effect better.

The present invention can achieve a good force sensing effect by means of the design of the force sensitive layer and the buffer material and protrusion with suitable elastic coefficients, so enable the display device to further have a good force sensing function in addition to the display function, thereby achieving a multifunctional display device.

The foregoing are merely preferred embodiments of the present invention, and any equivalent variations and modifications made according to the claims of the present invention shall fall within the scope of the present invention.

What is claimed is:
1. A display device, comprising:
a frame, including a bottom plate and a side plate, wherein the bottom plate has an inner surface, and the side plate is on the inner surface of the bottom plate;

a protrusion, disposed on the inner surface of the bottom plate;

a display panel, disposed on the protrusion, and comprising a force sensitive layer;

a protective substrate, disposed on the display panel; and a buffer material, disposed between the protective substrate and the side plate of the frame, wherein the buffer material has a greater elastic coefficient than the protrusion.

2. The display device according to claim 1, wherein a ratio of the elastic coefficient of the buffer material to the elastic coefficient of the protrusion is greater than 10.

3. The display device according to claim 1, wherein the elastic coefficient of the protrusion is greater than 0 mm/(gf/mm^2) and less than 0.00655 mm/(gf/mm^2).

4. The display device according to claim 1, wherein the elastic coefficient of the buffer material is greater than 0.0655 mm/(gf/mm^2).

5. The display device according to claim 1, wherein the protrusion and the frame are formed integrally.

6. The display device according to claim 1, wherein the protrusion is disposed on a support layer and the support layer is disposed on the bottom plate.

7. The display device according to claim 1, wherein a height of the protrusion is higher than 0.7 mm and less than 5 mm.

8. The display device according to claim 1, wherein a size of the protrusion is greater than 0.5 mm and less than 5 mm.

9. The display device according to claim 1, wherein the display panel comprises:
a first substrate, disposed on the protrusion;
a display medium, disposed on the first substrate; and
a second substrate, disposed on the display medium;
wherein a ratio of an overlapped projection area of the protrusion on the first substrate to an area of the first substrate is greater than 0.02% and less than 2%.

10. The display device according to claim 1, wherein the display panel comprises:
a first substrate, disposed on the protrusion;
a display medium, disposed on the first substrate and comprising:
a lower electrode layer, disposed on the first substrate;
a light-emitting material, disposed on the lower electrode layer; and
an upper electrode layer, disposed on the light-emitting material;
a first insulator, disposed on the upper electrode layer; and
a second substrate, disposed on the force sensitive layer, wherein the force sensitive layer is disposed between the first insulator and the second substrate.

11. The display device according to claim 10, wherein the force sensitive layer and the upper electrode layer constructs a capacitor.

12. The display device according to claim 10, further comprising a spacer disposed between the upper electrode layer and the first substrate, and the first insulator is overlapped with the spacer in a direction vertical to the first substrate.

13. The display device according to claim 12, further comprising a second insulator, disposed between the force sensitive layer and the second substrate, and the second insulator, the first insulator, and the spacer are overlapped with each other in the direction vertical to the first substrate.

14. The display device according to claim 1, wherein the display panel comprises:
a first substrate, disposed on the protrusion;
a display medium, disposed on the first substrate and comprising:
a lower electrode layer, disposed on the first substrate;
a light-emitting material, disposed on the lower electrode layer; and
the force sensitive layer, disposed on the light-emitting material;
a first insulator, disposed on the force sensitive layer; and
a second substrate, disposed on the first insulator,
wherein the protrusion is a metal.

15. The display device according to claim 14, further comprising a protective layer, disposed between the first substrate and the protrusion, wherein the force sensitive layer and the protrusion constructs a capacitor.

16. The display device according to claim 14, wherein the protrusion is disposed on a flexible circuit board, and the flexible circuit board is disposed on the bottom plate of the frame.

17. The display device according to claim 14, further comprising a touch sensitive layer disposed between the display panel and the protective substrate, wherein a flexible circuit board is coupled to the touch sensitive layer and extends above the bottom plate of the frame and between the display panel and the protective substrate, and the protrusion is disposed between the flexible circuit board and the first substrate.

18. The display device according to claim 14, further comprising a touch sensitive layer disposed between the second substrate and the first insulator.

19. The display device according to claim 18, further comprising a conductive glue and a flexible circuit board;
wherein the conductive glue is disposed between the first substrate and the second substrate, and the conductive glue is electrically coupled to the touch sensitive layer; and
wherein the flexible circuit board is electrically coupled to the force sensitive layer and conductive glue, and extends between the first substrate and the second substrate to the inner surface of the frame, and the protrusion is disposed between the flexible circuit board and the first substrate.

* * * * *